United States Patent
Chen et al.

[11] Patent Number: 6,091,657
[45] Date of Patent: Jul. 18, 2000

[54] INTEGRATED CIRCUIT HAVING PROTECTION OF LOW VOLTAGE DEVICES

[75] Inventors: Chun Chen, Emmaus; Richard Joseph McPartland, Nazareth, both of Pa.

[73] Assignee: Lucent Technologies Inc., Murray Hill, N.J.

[21] Appl. No.: 09/233,513

[22] Filed: Jan. 20, 1999

[51] Int. Cl.[7] .................................................. H01L 29/12
[52] U.S. Cl. .................... 365/226; 365/174; 365/185.18; 365/185.27; 257/339; 257/499; 257/500; 257/502
[58] Field of Search .................................... 365/226, 174, 365/185.18, 185.27; 257/339, 499, 500, 502

[56] References Cited

U.S. PATENT DOCUMENTS

| | | | |
|---|---|---|---|
| 5,150,184 | 9/1992 | Eklund | 357/34 |
| 5,465,054 | 11/1995 | Erhart | 430/30 |
| 5,539,334 | 7/1996 | Clapp, III et al. | 326/68 |
| 5,604,449 | 2/1997 | Erhart | 326/81 |
| 5,682,051 | 10/1997 | Harrington, III | 257/369 |
| 5,731,619 | 3/1998 | Subbanna | 257/374 |
| 5,732,021 | 3/1998 | Smayling et al. | 365/185.29 |
| 5,747,850 | 5/1998 | Mei | 257/328 |
| 5,761,121 | 6/1998 | Chang | 365/185.14 |
| 5,767,551 | 6/1998 | Smayling et al. | 257/370 |
| 5,807,780 | 9/1998 | Dans et al. | 438/311 |
| 5,821,800 | 10/1998 | Le et al. | 327/333 |
| 5,963,476 | 10/1999 | Hung et al. | 365/185.22 |

FOREIGN PATENT DOCUMENTS

| | | | |
|---|---|---|---|
| 362243422 | 10/1987 | European Pat. Off. | H03K 19/094 |

OTHER PUBLICATIONS

"High Voltage CMOS Logic Circuit Using Low Voltage Transistors," Cochran–McLellan, Case 18–4, Serial #08/985709, filed on Dec. 5, 1997, 12 pages.

*Primary Examiner*—Viet Q. Nguyen
*Attorney, Agent, or Firm*—James H. Fox; Mark A. Kurisko

[57] ABSTRACT

When flash memory devices are scaled down into the deep-submicron regime, tub erase is being increasingly deployed because it features lower erase current and better reliability performance than the conventional source-side erase scheme. However, tub erase requires higher voltages to be applied to the flash memory device. In a typical design, during tub erase 10 to 12 volts is applied to the tub, source and drain, and –6V is applied to the control gate of the flash memory device. However, in the state-of-the-art CMOS processes (usually used at a power supply voltage 3.3 V and below), it is difficult to build high voltage (HV) devices to support source/drain voltages of more than 6 volts unless the process complexity is significantly increased. Therefore, the required HV devices prevent tub erase from being widely used, especially for embedded applications. In the present invention, a separate protection tub is added to the on-pitch devices close to the memory array, and all these on-pitch devices share the same protection tub. While the main cell array tub is biased at 10 to 12 volts during tub erase, an intermediate voltage, 6 volts for example, can be used to bias the protection tub, which prevents the junction breakdown of those peripheral devices. At times other than tub erase, the protection tub is biased at 0 volts. Therefore, the high voltages of 10 to 12 volts are isolated by 6 volt triple-tub CMOS devices, and it becomes feasible to embed an advanced tub-erase flash memory in a CMOS logic process.

15 Claims, 1 Drawing Sheet

INTEGRATED CIRCUIT HAVING PROTECTION OF LOW VOLTAGE DEVICES

BACKGROUND OF THE INVENTION

1. Field of the invention

The present invention relates to an integrated circuit having one or more devices formed in a high voltage tub, and one or more peripheral devices coupled thereto.

2. Description of the Related Art

Flash memory EEPROM devices are widely used in the semiconductor industry. These provide electrically-erasable programmable read-only memory (EEPROM) cells in an array that includes circuitry for erasing the information stored in a large number of cells at the same time, referred to as "flash erase". This flash erase is accomplished by applying a relatively high erase voltage simultaneously to all of the cells located in a given doped semiconductor tub region. In particular, as flash memory devices are scaled down into the deep-submicron regime, tub erase is being increasingly deployed because it features lower erase current and better reliability performance than the conventional source-side erase scheme. However, tub erase requires that a voltage higher than that required in normal operation to be applied to the flash memory device. For example, in one commercial design, during tub erase a high voltage of 10 to 12 volts is applied to the tub, source and drain, and −6 volts is applied to the control gate of the flash memory device. Therefore, the transistors connected to the tub must withstand the high voltage (e.g., 10 to 12 volts) required for the erase operation.

However, in state-of-the-art CMOS integrated circuit fabrication processes, especially those designed for use at 3.3 volts and below, it is a difficult task to build high voltage (HV) devices to support source/drain voltages of more than 6 volts unless the process complexity is significantly increased. That is, flash memory fabrication processes usually require several additional process steps to build HV devices strong enough to support the high voltages needed during the flash erase. For example, the source/drain to substrate reverse-bias breakdown voltage is usually one limiting factor in the operation of a MOS transistor. To increase this voltage above the nominal level obtained for the devices in the memory array usually requires extra implant steps to form source/drain junctions that have a highly graded dopant profile. This requires several extra process steps to form the HV devices, which prevents tub erase from being widely used, especially for embedded applications; that is, where memory cells and logic transistors are formed on the same integrated circuit.

SUMMARY OF THE INVENTION

We have invented an integrated circuit having at least one high voltage device, and also having at least one peripheral device coupled thereto. The peripheral device is protected from high voltage present on the high voltage device by a protection tub biased at an intermediate voltage. In a typical embodiment of the invention, the at least one high voltage device comprises memory devices capable of a flash erase operation by a high voltage applied to a high voltage tub in which the memory devices are formed. The protection tub is typically formed in proximity to the high voltage tub, and multiple on-pitch peripheral devices may share the same protection tub.

DETAILED DESCRIPTION

The following detailed description relates to an integrated circuit having one or more devices formed in a given tub referred to herein as the "high voltage" tub, and one or more peripheral devices formed in a "protection tub". The one or more devices formed in the high voltage tub illustratively comprise a memory array. The one or more peripheral devices are coupled with a conductor 10 to the devices formed in the high voltage tub, and are protected from high voltage present on the array by a tub biasing technique. Note however that these terms do not imply a necessary difference in the construction of the tubs, and they may if desired be formed during the same sequence of operations with regard to dopant implant, diffusion, etc. The high voltage is illustratively used for the flash erase operation of EEPROM devices. As used herein, the term "peripheral devices" refers generally to any type of device coupled to the devices in the high voltage tub. In the illustrative case of a memory array, the peripheral devices are typically column access transistors, used to provide access to the cells in a given column for a read, write, or precharge operation. That type of access device is typically formed on the same pitch (i.e., spacing) as the columns, in order to conserve space. However, other types of peripheral devices may be formed without regard to the pitch of the columns, and which may be referred to as "off-pitch" devices herein. The off-pitch devices are usually coupled with a conductor 116 to the memory array through on-pitch devices, and may serve such functions as supplying voltages for programming and reading the memory array.

Also as is understood in the art, the term "tub" refers to a doped semiconductor region formed in an underlying semiconductor region. The underlying region may be a semiconductor substrate of the opposite doping type. Alternatively, a first tub region of a given dopant conductivity may be located in a second tub region of the opposite dopant conductivity type, typically to prevent conduction from the first tub into the underlying substrate of the given conductivity type. The term "triple tub" is often used to describe that type of construction. Active MOS devices having highly doped source/drain regions are typically formed in the uppermost tub (i.e., adjacent to the surface of the semiconductor wafer). The term "well" is also used in the art synonymously with "tub".

Figure 1:
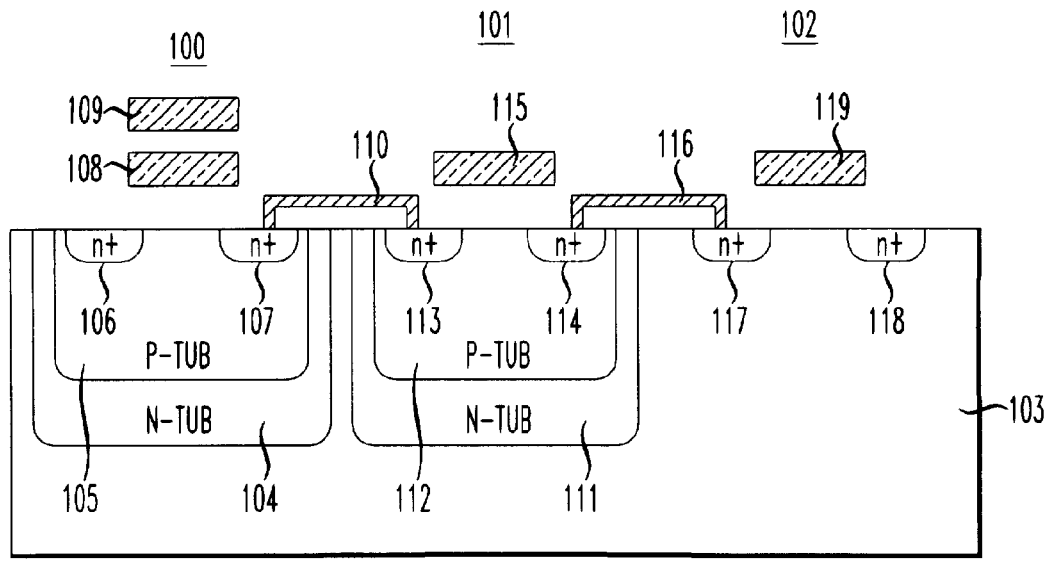
FIG. 1 shows a cross-section of an integrated circuit that implements the invention.

An illustrative cross-section of a flash EEPROM memory is shown in FIG. 1. The memory array comprises a multiplicity of memory devices 100 that each comprise source/drain regions 106 and 107, a floating gate 108 and control gate 109, according to principles known in the art. The source/drain regions of the multiplicity of memory devices are formed in a common p-tub 105, referred to illustratively as the "high voltage tub" herein, which in turn is formed in an n-tub 104 formed in the underlying p-substrate 103. The on-pitch peripheral n-channel devices 101 are formed in a common protection p-tub 112, which is formed in an n-tub 111 that in turn is formed in the underlying p-substrate. The reverse-bias of the n-tubs (104 and 111) to the underlying p-substrate provides for electrical isolation between the memory array and the peripheral devices for positive voltages applied to the tubs. For this purpose, the protection tub 112 and the underlying tub 111 are spaced apart from the high voltage tub 105 and the underlying tub 104 where the memory array is located. Other forms of electrical isolation are known.

During tub erase a high positive voltage HV, illustratively 10 to 12 volts, is applied to the high voltage tub 105, and also the sources 107 and drains 106 of all the memory devices 100, and a negative voltage, illustratively −6 volts, is applied to their gates 109. The high voltage HV may be supplied from a power supply external to the integrated circuit on which the EEPROM array is formed, or alternatively may be supplied by an on-chip source (e.g., charge pump) that converts the chip's power supply voltage (Vdd) to a higher voltage. The electrical contacts to these regions may be of conventional type, and are not shown for clarity. In addition, the gate oxide and inter-level dielectric regions (typically comprising silicon dioxide) are not shown, for clarity. For the above-noted purposes, the structure in FIG. 1 is connected to a protective voltage source, illustratively a voltage regulator 223 shown in schematic form in FIG. 2. The intermediate voltage output of regulator 223, illustratively 6 volts, is applied via lines 211, 210 and 209 to the protective p-tub 112 and underlying n-tub 111, respectively. Note that the conductors 210 and 209 may contact the respective tubs via heavily doped tub contact regions, as is known in the art. During erase operations, the erase signal is low, thereby enabling the regulator 223 and biasing the protective p-tub 112 and underlying n-tub 111 at 6 volts though conductors 210 and 209, respectively. At other times (e.g., during a read operation), erase is high and the regulator is disabled. Furthermore, the transistor 222 is turned on, so that lines 211 and 224 are pulled low, and the protective tub 112 is placed at 0 volts with respect to the substrate 103.

The junction breakdown of the peripheral devices is thereby prevented, since the devices in the protection tub have a source/drain to tub junction breakdown of 6 volts. A voltage not higher than one diode voltage drop below the p-tub (112) voltage, illustratively 5.3 volts, is present at the sources of the on-pitch devices, as a result of the protection tub bias. In addition, this 5.3 volts is may be safely applied to off-pitch CMOS devices 102 with breakdown voltage of 6 volts. In other cases except tub erase, the voltages present on this portion of the flash memory chip are not higher than 6 volts, and the protection tub 112 is switched back to 0 volts by device 220.

While the use of a voltage source 223 is shown, the protective tub may in some cases be allowed to simply float, and be biased by a momentary flow of current to the protective tub due to the reverse-breakdown from the drain 113 to the protective tub. After the tub reaches a steady-state voltage, the momentary current flow ceases, and the tub floats, typically at a floating voltage of about 6 to 7 volts on the protective tub, which also prevents the breakdown of the peripheral devices. However, the use of a separate voltage source allows for a more controlled application of the protective voltage, and is preferred in many cases. Note that conductor 209 also places the underlying n-tub 111 at the same voltage as the protective p-tub 112 in the illustrative case. However, if desired, the n-tub may alternatively be unconnected to the intermediate voltage source, in which case it will be raised to the voltage on the p-tub 112 minus one diode voltage drop; that is, about 5.3 volts in the illustrative case.

Figure 2:
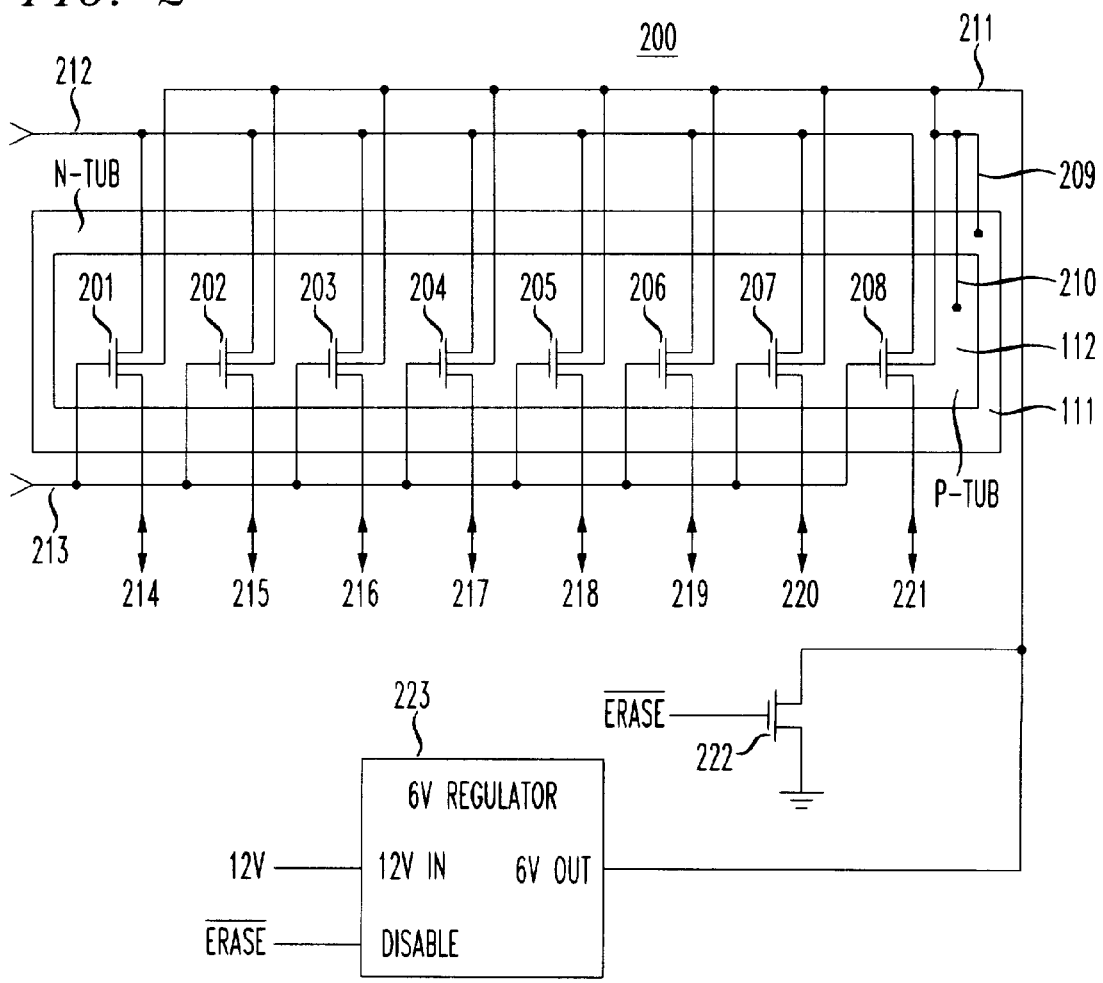
FIG. 2 shows circuitry that may be used in implementing the invention.

An example of the above scheme is the protection of on-pitch precharge devices 200, as shown in FIG. 2. The individual NMOS column precharge devices 201 to 208 are located in a p-tub 112 (the "protection tub") that is in turn located in an n-tub 111, as seen schematically in top-view. The protection tub 112 may either be biased at 6 volts, or alternatively floated by an off-state NMOS device (120 in FIG. 1), which in turn will induce a bias of about HV/2 in the protection tub 112. If the gate oxides of the precharge devices also need protection, a 6-volt bias on line 213 can be used to bias the gates of all the precharge devices. During the precharge operation, the voltage on line 212 is typically placed at 0.8 volts, and is allowed to float at other times (for example, during erase). The voltage on line 211 is typically 6 volts, in order to bias the p-tub 112 as described above. Hence, the main cell array tub may be biased at 10 to 12 volts during tub erase, and the intermediate voltage, 6 volts for example, is used to bias the protection tub, which prevents the junction breakdown of those peripheral devices. At times other than the tub erase operation, the protection tub is biased at 0 volts by device 120. Therefore, high voltages of 10 to 12 volts are isolated by the 6 volt triple-tub CMOS devices, and it becomes feasible to embed an advanced tub-erase flash memory in a low-voltage CMOS process.

While a protective voltage of one-half the high voltage (½ HV) has been used illustratively herein, other protective tub voltages may be used. We recommend that the protective tub be biased at a voltage in the range of from 0.4 to 0.6 of the high voltage being protected against, which is typically measured with respect to the semiconductor substrate as a reference. It can be seen from the above description that the present invention protects devices formed in the protection tub by reducing the reverse-bias voltage between the n-well 111 (underlying the protection tub 112) and the underlying substrate 103 to a level less than that which causes junction breakdown. In adition, the gate-to-source voltage of the transistors in the protection tub is likewise reduced when a low voltage (e.g., 0 volts) is applied to the gates. Furthermore, protection is provided to other peripheral devices coupled to those in the protection tub (e.g., the off-pitch devices) by reducing the voltage across their source/drain regions. This may reduce drain-to-source voltages (e.g., from drain 117 to source 118), as well as reduce gate-to-drain voltage, thereby protecting the gate oxide. Other voltages may be reduced, depending on whether these other peripheral devices are formed in tubs, and what voltages are present on the tubs. Still other benefits of the inventive protective technique will be apparent to persons of skill in the art for various forms of integrated circuit device construction and operation.

We claim:

1. An integrated circuit having at least one device comprising a first source/drain region connectable to a high voltage source and a second source/drain region coupled to a peripheral device, with the source/drain regions being of a given conductivity type formed in a high voltage tub of the opposite conductivity type, characterized in that said peripheral device comprises source/drain regions of said given conductivity type formed in a protection tub of said opposite conductivity type, and with said protection tub being electrically isolated from said high voltage tub, and wherein said protection tub is adapted to being biased at an intermediate voltage level that is less than said high voltage level.

2. The integrated circuit of claim 1 wherein said at least one device comprises an array of memory devices formed in said high voltage tub.

3. The integrated circuit of claim 2 wherein said memory devices are EEPROM devices that may be flash erased by a high voltage applied to said high voltage tub.

4. The integrated circuit of claim 1 comprising multiple peripheral devices in the form of column access devices formed on the same pitch as corresponding columns of said memory devices in said array.

5. The integrated circuit of claim 4 wherein said column access devices are formed in the same protection tub.

6. The integrated circuit of claim 1 wherein said given conductivity type is n-type, said opposite conductivity type is p-type, and said high voltage level is a positive voltage with respect to the voltage on said substrate.

7. The integrated circuit of claim 1 wherein said intermediate voltage level is in the range of 0.4 to 0.6 of said high voltage level.

8. The integrated circuit of claim 1 further comprising a voltage regulator for generating said intermediate voltage level from said high voltage level.

9. The integrated circuit of claim 1 wherein said intermediate voltage level is generated by momentary forward conduction from a source/drain region to said protection tub.

10. An integrated circuit having memory devices arrayed in columns and formed in an high voltage tub, with said memory devices being coupled to column access devices formed on the same pitch as corresponding columns of said memory devices, and wherein said memory devices are erasable by a high voltage applied to said high voltage tub, characterized in that said column access devices comprises source/drain regions of a given conductivity type formed in a protection tub of the opposite conductivity type, and with said protection tub being formed in another tub of the given conductivity type that is formed in a substrate of said opposite conductivity type, and wherein a conductor is connected to said protection tub for biasing said protection tub to an intermediate voltage level that is less than said high voltage level.

11. The integrated circuit of claim 10 further comprising off-pitch peripheral devices coupled to said memory devices through said column access devices, wherein said off-pitch peripheral devices are formed on a different pitch as said corresponding columns of said memory devices.

12. The integrated circuit of claim 10 further comprising a voltage regulator for generating said intermediate voltage level from said high voltage level.

13. The integrated circuit of claim 10 wherein said given conductivity type is n-type, said opposite conductivity type is p-type, and said high voltage level is a positive voltage with respect to the voltage on said substrate.

14. The integrated circuit of claim 10 wherein said intermediate voltage level is in the range of 0.4 to 0.6 of said high voltage level.

15. (ADD) An integrated circuit comprising:

at least one device having a first source/drain region connectable to a high voltage source and a second source/drain region, with the first and second source/drain regions being of a given conductivity type formed in a high voltage tub of the opposite conductivity type, a peripheral device coupled to the second source/drain region of the at least one device, the peripheral device having source/drain regions of said given conductivity type formed in a protection tub of said opposite conductivity type, and with said protection tube being electrically isolated from said high voltage tub, and wherein said protection tub is adapted to being biased at an intermediate voltage level that is less than said high voltage level.

* * * * *